(12) United States Patent
Lolli

(10) Patent No.: US 8,397,377 B2
(45) Date of Patent: Mar. 19, 2013

(54) APPARATUS FOR MAKING AN ANTENNA FOR WIRE TRANSPONDERS OF ELECTRICALLY CONDUCTIVE MATERIAL

(75) Inventor: Marcello Lolli, Casteinuovo Rangone (IT)

(73) Assignee: Smart Res S.p.A., Spilamberto (MO) (IT)

( * ) Notice: Subject to any disclaimer, the term of this patent is extended or adjusted under 35 U.S.C. 154(b) by 257 days.

(21) Appl. No.: 12/790,290

(22) Filed: May 28, 2010

(65) Prior Publication Data
US 2010/0299914 A1 Dec. 2, 2010

Related U.S. Application Data

(62) Division of application No. 11/883,159, filed as application No. PCT/IB2006/000156 on Jan. 27, 2006, now Pat. No. 7,752,743.

(30) Foreign Application Priority Data

Jan. 28, 2005 (IT) .............................. MO2005A0017

(51) Int. Cl.
*B23P 19/00* (2006.01)

(52) U.S. Cl. ................. 29/748; 29/747; 29/745; 29/600; 29/33 M; 29/865

(58) Field of Classification Search ............ 29/745–748, 29/600, 831, 834, 592.1; 228/179.1, 180.5, 228/110.1, 180.2–180.21
See application file for complete search history.

(56) References Cited

U.S. PATENT DOCUMENTS

| | | | |
|---|---|---|---|
| 3,627,978 A | 12/1971 | Endo et al. | |
| 4,351,468 A * | 9/1982 | Floury et al. | 228/4.5 |
| 4,477,304 A * | 10/1984 | Westermann | 156/250 |
| 5,395,040 A | 3/1995 | Holzmann | |
| 5,495,976 A * | 3/1996 | Mironesco et al. | 228/110.1 |
| 5,515,606 A | 5/1996 | Albeck et al. | |

(Continued)

FOREIGN PATENT DOCUMENTS

| | | |
|---|---|---|
| DE | 39 41 318 | 6/1990 |
| DE | 101 21 925 | 11/2002 |

(Continued)

OTHER PUBLICATIONS

International Search Report for PCT/IB2006/000156 mailed Jul. 17, 2006.

*Primary Examiner* — Minh Trinh
(74) *Attorney, Agent, or Firm* — Nixon & Vanderhye P.C.

(57) ABSTRACT

An apparatus for making an antenna for wire transponders of electrically conductive material, comprising at least one depositing device for depositing said wire on a substrate placed on a support element, said at least one depositing device and said substrate being movable with respect to each other; said support element being movable along directions parallel to at least two axis of a Cartesian reference system. A method for making an antenna comprising providing a substrate intended to receive said antenna, providing a lamina or wire of electrically conductive material wound on at least one reel, unwinding said lamina, or said wire from said at least one reel, pressing said lamina, or wire, on a surface of said substrate by means of at least one pressing element, fixing said lamina, or wire, to said substrate, separating, by means of at least one cutting device a stretch of lamina, or wire, fixed to said substrate from the remaining lamina, or wire, wound on said at least one reel, said substrate being movable with respect to an assembly comprised of said at least one reel, said at least one pressing and said at least one cutting device, along at least one direction substantially parallel to an axis of a Cartesian reference system.

12 Claims, 10 Drawing Sheets

U.S. PATENT DOCUMENTS

| | | |
|---|---|---|
| 6,088,230 A | 7/2000 | Finn et al. |
| 6,153,034 A | 11/2000 | Lipsker |
| 6,401,001 B1 | 6/2002 | Jang et al. |
| 6,665,931 B2 | 12/2003 | Yamaguchi et al. |
| 6,705,511 B1 | 3/2004 | Dames et al. |
| 6,810,580 B2 | 11/2004 | Yamaguchi et al. |
| 7,277,770 B2 | 10/2007 | Huang |
| 2004/0074086 A1 | 4/2004 | Yamaguchi et al. |
| 2008/0143534 A1 | 6/2008 | Lolli |

FOREIGN PATENT DOCUMENTS

| | | |
|---|---|---|
| JP | 4-192391 | 7/1992 |
| JP | 6-114314 | 4/1994 |
| JP | 2004-304036 | 10/2004 |

* cited by examiner

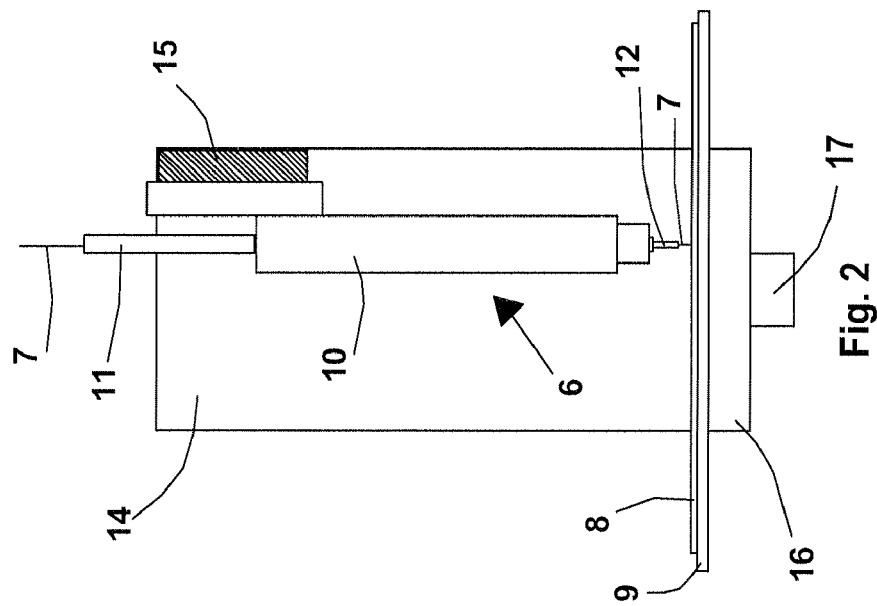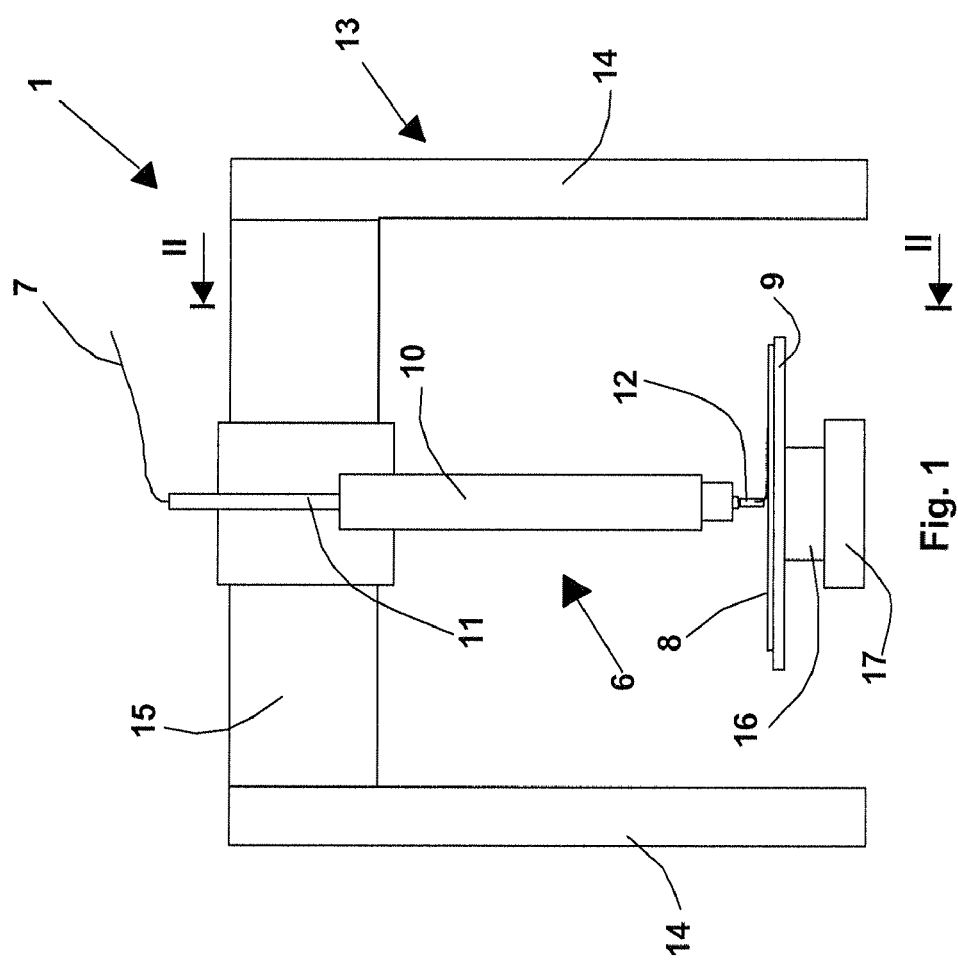

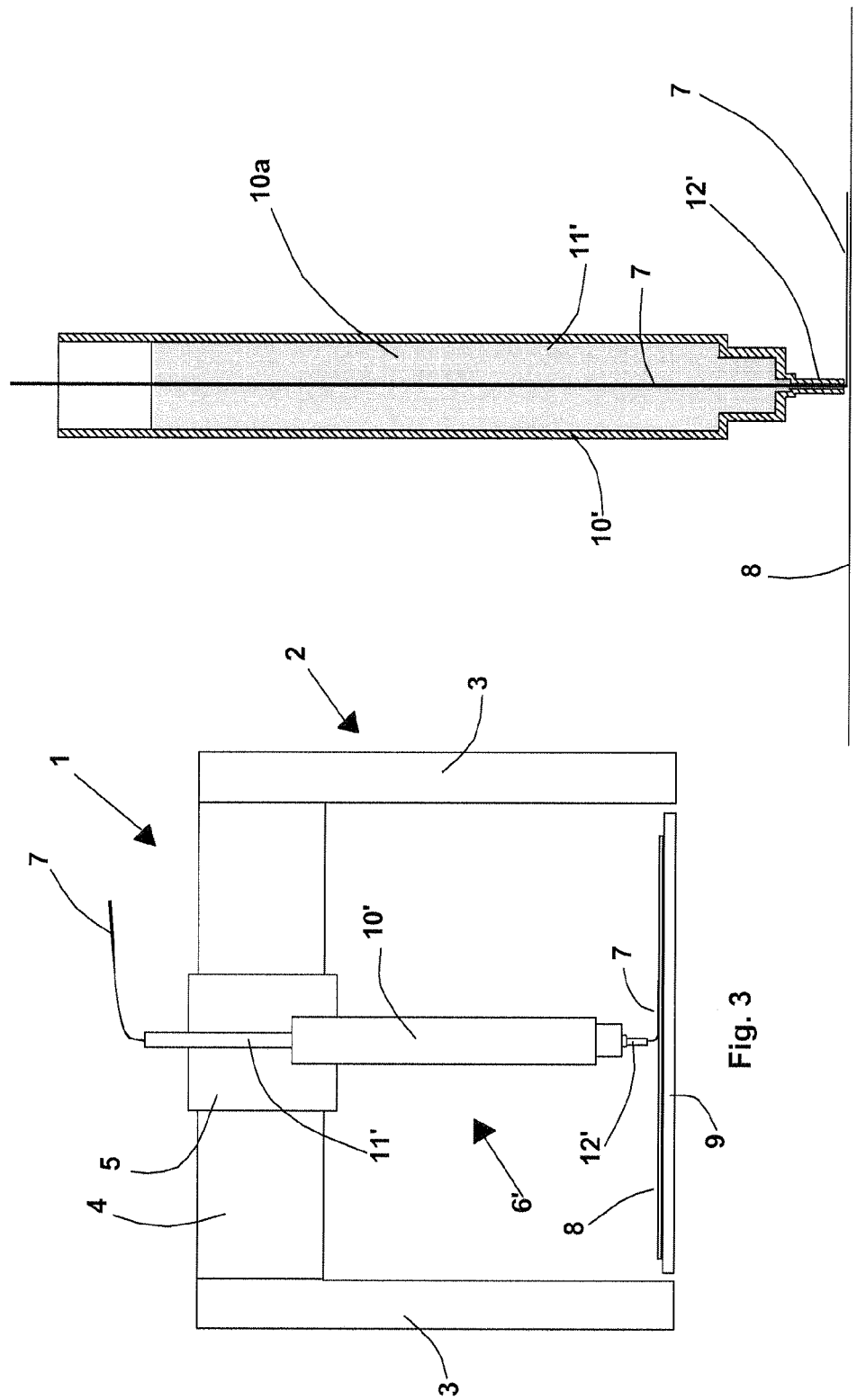

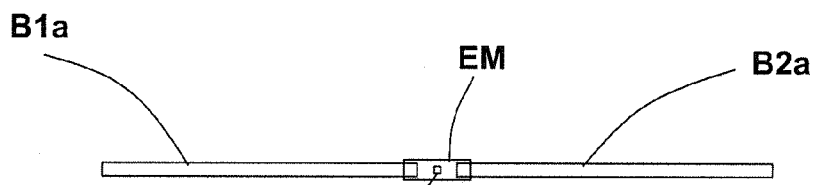
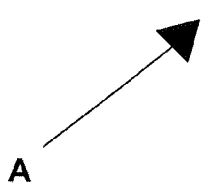
Fig. 12
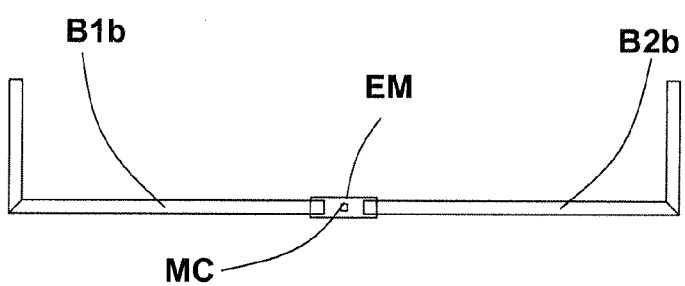
Fig. 13
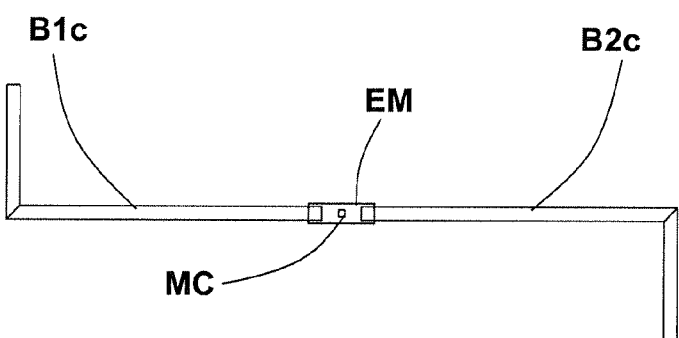
Fig. 14
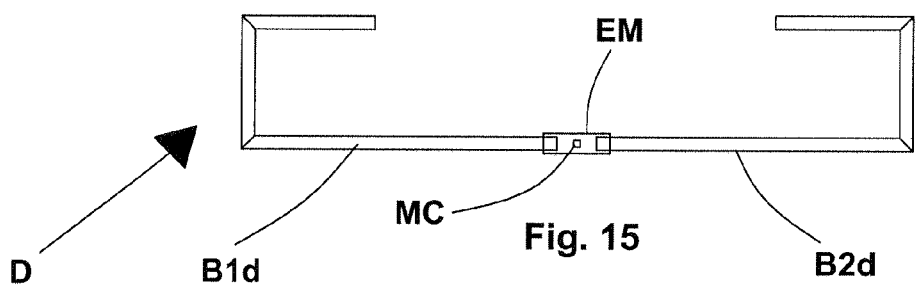
Fig. 15

APPARATUS FOR MAKING AN ANTENNA FOR WIRE TRANSPONDERS OF ELECTRICALLY CONDUCTIVE MATERIAL

This application is a divisional of U.S. patent application Ser. No. 11/883,159, filed Jul. 27, 2007 now U.S. Pat. No. 7,752,743, which is a national phase of PCT International Application No. PCT/IB2006/000156, filed 27 Jan. 2006. PCT/IB2006/000156 claims priority to IT Application No. MO2005A000017, filed 28 Jan. 2005. The entire contents of each of these applications are incorporated herein by reference in their entirety.

The present invention relates to a method and an apparatus for making antennas for RFID transponders, i.e. transponders for radiofrequency identifying devices.

RFID transponders consist of two essential parts, the so-called antenna, made as a coil in conductive material and an integrated circuit connected to the two ends of the antenna. Amongst the conductive materials with which the antenna can be constructed, copper wire covered with an insulating glaze is increasingly used today.

Apparatuses are known for making antennas in copper wire that deposit and fix the wire onto a substrate that is then used in the subsequent processes. Nevertheless, these apparatuses have a high cost/productivity ratio.

They are in fact constituted by a certain number of heads, normally six, each of which is supplied by a reel of glazed copper wire and deposits the wire on a substrate, normally in PVC. These heads move, drawing with the wire the pattern of the antenna and attaching the wire to the substrate by means of a vibrating hammer that follows the head in the movement thereof. The substrate either has to be of a material that softens with the heat generated by the vibrating hammer, retaining the wire, like PVC, or has to be previously coated with a product that performs the same function.

The heads that are thus constructed are relatively complex and heavy mechanisms, which means that both for economic questions and for questions of inertia to motion, the number of heads applicable to an apparatus is relatively small. This causes a very high cost/productivity ratio.

DE-A-3941318 discloses a method for making an integrated circuit on a ceramic substrate wherein a ceramic or similar substrate is positioned on support means movable along directions parallel to two axes of a Cartesian reference system under depositing means from which thick-film paste is ejected. The nozzle is raised and lowered in a direction parallel to a third axis of said Cartesian reference system.

In addition transponders RFID UHF are known, that is transponders operating at frequencies higher than 800 MHz (UHF), in which the antenna is a dipole antenna made of a lamina of electrically conductive material, for instance metallic material.

It is known in the state of art to make dipole antennas for RFID transponders starting from a lamina of electrically conductive material coupled with a flexible substrate; the profile of the dipole is cut on the lamina and, subsequently, the electrically conductive material outside the cut profile is removed, the electrically conductive material remaining on the flexible substrate constituting the dipole antenna.

Such a method requires the use of expensive apparatuses for making the cut of the profile of the antenna and, in addition, the electrically conductive material removed during production of the antenna is waste material, which implies a further increase of costs. Finally, the flexible substrate must consists of a material which is not damaged during the cutting operations of the profile of the antenna, which may involve considerable mechanical or thermal stresses for the substrate. This need limit the materials which may be used for the flexible substrate and require a selection of said materials depending on the method used to cut the profile of the antenna.

Another known method provides for obtaining the dipole antenna by printing the antenna on a flexible substrate using electrically conductive inks.

Also this method involves comparatively high costs; in addition the antennas made of electrically conductive inks have an electric conductivity substantially lower than the conductivity of antennas made of laminas of electrically conductive material. The lower conductivity involves performances that are qualitatively lower than the performances of antennas made of laminas of electrically conductive material.

The present invention aims to provide an apparatus and a method for making antennas for RFID transponders that are relatively cheap and enable high productivity with moderate costs.

According to a first aspect of the present invention there is provided an apparatus for making an antenna for wire transponders of electrically conductive material, comprising at least one depositing device for depositing said wire on a substrate, said at least one depositing device and said substrate being movable with respect to one another, characterised in that it comprises a support element for said substrate, said support element being movable in directions parallel to the axes of a Cartesian reference system.

Owing to the provision of a substrate for the support movable according to the axes of a Cartesian reference system, it is possible to keep the at least one depositing device stationary with respect to said three axes. This allows the amount of masses in motion to be kept substantially constant, independently of the number and the mass of the depositing devices used, which makes possible a considerable increase in productivity with respect to the apparatuses known from the state of art.

The at least one depositing device may be made rotatable with respect to an axis perpendicular to the element supporting the substrate. This makes possible to optimize the deposition of the wire on the substrate.

According to another aspect of the present invention a method is provided for making an antenna for transponders, comprising depositing a wire in electrically conductive material on a substrate according to a preset pattern, fixing said wire to said support, characterised in that it comprises, before said depositing, applying to the outer surface of said wire an adhesive substance suitable for assuring the fixing of said wire on said substrate.

Owing to this aspect of the invention it is possible to fix in a simple, rapid and cheap manner the wire to the substrate, furthermore significantly simplifying the structure of the depositing means.

In fact, it no longer being necessary to perform hammering of the wire to ensure adhesion thereof to the substrate, the overall dimensions, weight and costs of the depositing means are significantly reduced.

According to a further aspect of the present invention a method is provided for making an antenna comprising providing a substrate intended to receive said antenna, providing at least one lamina, or wire, of electrically conducive material wound on a reel, unwinding said at least one lamina, or wire, from said reel, pressing said lamina, or wire, on a surface of said substrate by means of a pressing element, fixing said lamina, or wire, of electrically conductive material to said substrate, separating by means of a cutting device a portion of said lamina, or wire, fixed to said substrate from the remaining lamina, or wire, wound on said reel, said substrate and an assembly comprised of said reel, said pressing element, and said cutting device being movable with respect to one another.

Owing to the invention, it is possible to obtain on a substrate in a simple and economical way wire antennas having whatever shape, or dipole antennas having arms of whatever shape, for instance a rectilinear shape, a zig-zag shape, a curvilinear shape, or a combination of said shapes.

The realization does not require expensive apparatuses, because, for instance, for realizing the dipole antenna it is enough a reel from which the lamina of electrically conductive material may be unwound, a plane mobile with respect to the reel for supporting the substrate, a pressing element for pressing on the substrate the lamina of electrically conductive material unwound from the reel and a cutting device for cutting the lamina of electrically conductive material.

Alternatively, it is possible to keep stationary the plane supporting the substrate and make the assembly comprised of reel, pressing element and cutting device mobile with respect to said plane.

The invention will now be disclosed with reference to the attached drawings, in which:

FIG. 1 is a schematic frontal view of an embodiment of an apparatus according to the invention;

FIG. 2 is the section II-II of FIG. 1;

FIG. 3 is a schematic front view of a further embodiment of an apparatus according to the invention;

FIG. 4 is an enlarged schematic detail of FIG. 3;

FIGS. 12 to 15 illustrate some examples of shapes of dipole antennas obtainable with the method according to the invention.

Figure 5:
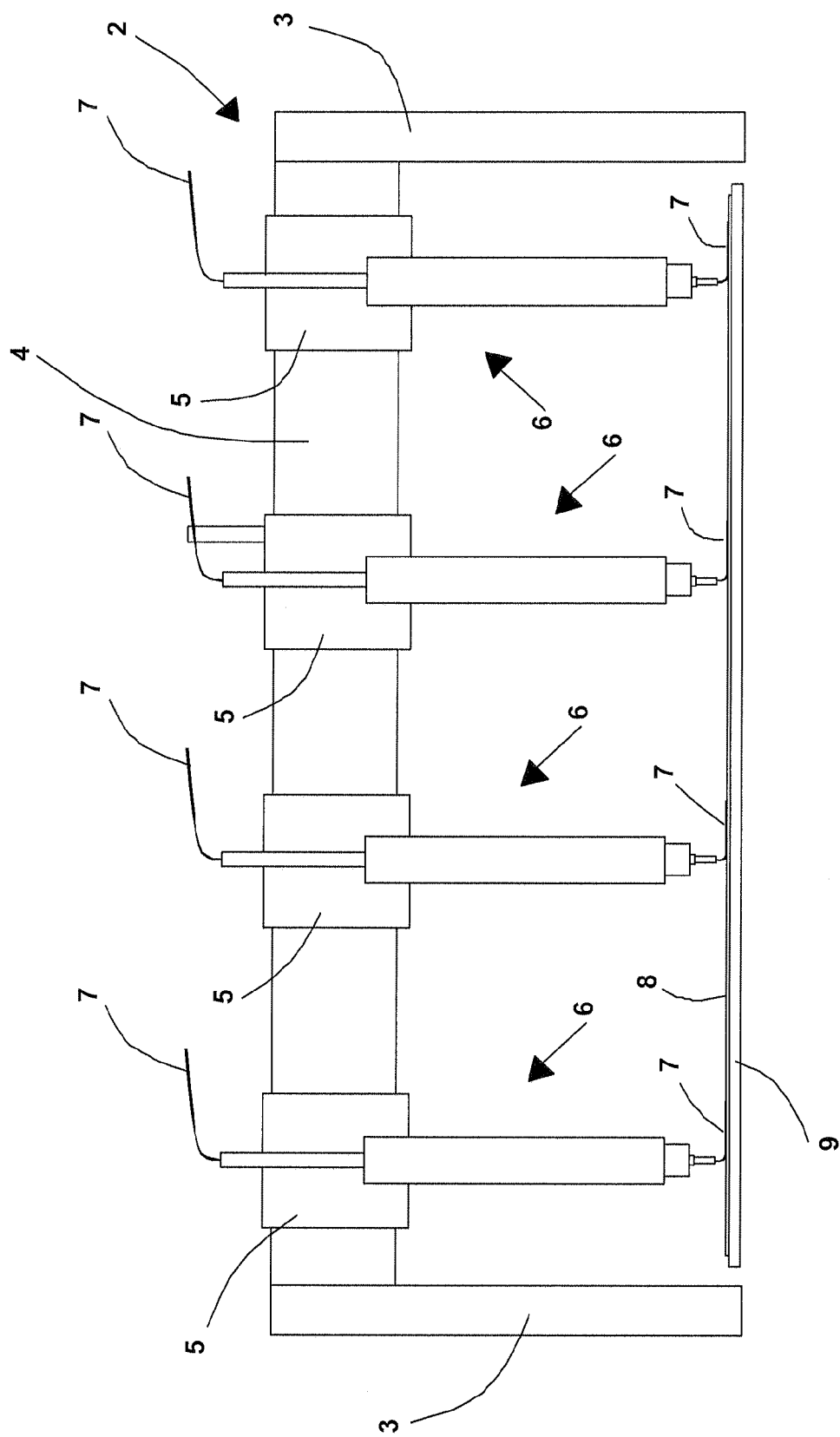
FIG. 5 is a schematic frontal view of an apparatus according to the invention provided with a plurality of depositing means.
Figure 6:
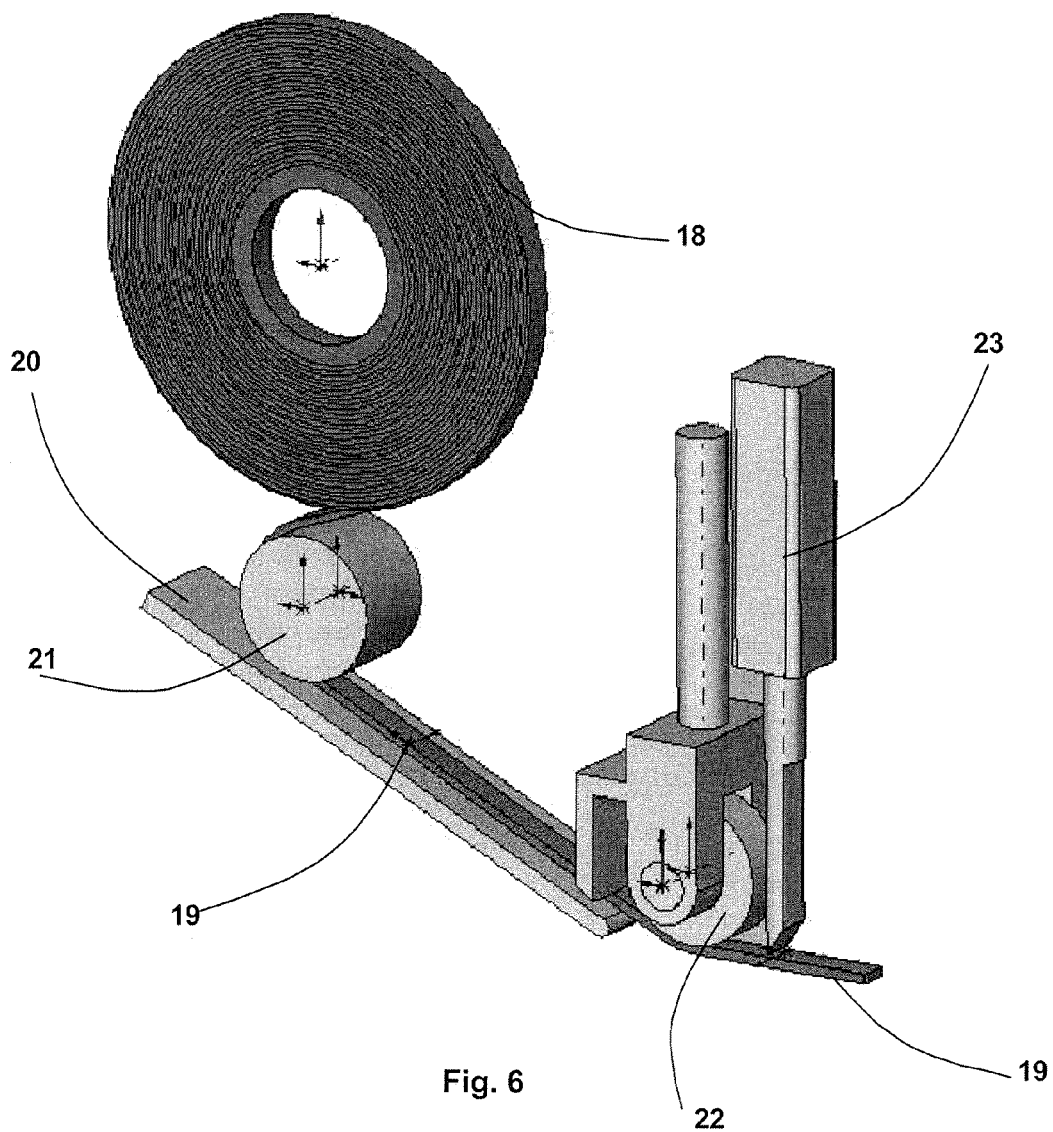
FIG. 6 is a schematic perspective view of an example of a way of making an antenna according to the invention.

With reference to FIG. 1, an apparatus 1 for making a transponder antenna according to the invention comprises a support structure 13, for example in the shape of a portal, comprising a pair of fixed uprights 14 and a vertically movable crosspiece 15. To the crosspiece 15 a device 6 is coupled for depositing a wire 7 in electrically conductive material, for example a glazed copper wire, on a substrate 8 deposited on a support element 9.

The device 6 comprises a body 10 having a first guide element 11 at an upper end of the body 10 for guiding the wire 7 and a second guide element 12 which guide the wire at a lower end of the body 10, at which the wire is deposited on the substrate 8.

The support element 9 is fixed to a first sliding element 16, for example driven by a first linear actuator (not shown) cross-fixed to a second sliding element 17, driven by a second linear actuator (which is not shown either), the movement of the sliding elements 16 and 17 occurring in two directions that are perpendicular to one another on a plane perpendicular to the vertical movement of the crosspiece 15.

The movement of the support element 9 makes possible to obtain the transponder antenna without the device 6 for depositing the wire performing translation movements in a plane parallel to the surface of the substrate 8. This reduces substantially the masses that have to be moved during the deposition of the wire 7. In fact, during the deposition of the wire 7, the translation movements needed to draw the profile of the antenna are performed only by the support element 9, with the substrate 8 thereon, whilst the device 6 does not perform any translation movement. Therefore, an apparatus 1 according to the invention may be provided with a high number of devices 6, without considerably increasing the masses in motion of translation during the deposition of the wire, the only increase of the masses in motion of translation depending, if necessary, on an increase of the dimensions of the support element 9. This allows the productivity of the apparatus 1 according to the invention to be increased as compared with the productivity of apparatus known from the state of art.

Advantageously, the device 6 for depositing the wire 7 may be made rotatable with respect to an axis perpendicular to the surface of the substrate 8. This allows the deposition of the wire to be optimized in the portions of the antennas in which there is a change of direction of the wire 7.

In a variation of the embodiment illustrated in FIG. 1 rather than making the device 6 for dispensing and depositing the wire 7 vertically movable by means of the motion of the crosspiece 15, it is possible to make the support 9 vertically movable, for instance by making the second sliding element 17 vertically movable. This makes possible to further reduce the masses in motion in the apparatus according to the invention and, as a consequence, to increase further the productivity.

The adhesion of the wire 7 to the substrate 8 may be obtained by applying in advance an adhesive substance on the substrate 8, or by using a vibrating hammer associated with the device 6, as it is known from the state of art.

In FIG. 3 another embodiment of an apparatus 1 according to the invention is illustrated comprising a support structure 2, for instance shaped as a portal, provided with a pair of uprights 3 and a crosspiece 4. On the crosspiece 4, in a direction substantially parallel to a first axis of a Cartesian reference system, a slide 5 is slidable, with which a device 6' is coupled for depositing a wire 7 in electrically conductive material, for example a glazed copper wire, on a substrate 8 arranged on a support element 9'. The device 6' comprises a container 10' inside which a quick setting adhesive substance 10a (FIG. 4) is fed, capable of assuring a quick adhesion of the wire 7 on the substrate 8, a guide element 11' for guiding the wire 7 into the container 10' and a dispensing spout 12' through which the wire 7 is deposited on the substrate 8 to obtain an antenna for a RFID device.

The container 10' is fixed to the slide 5, slidable on the crosspiece 4. The crosspiece 4 is in turn slidable vertically in relation to the uprights 3, i.e. in a direction substantially parallel to a second axis of said Cartesian reference system. The support structure 2 is made slidable, for example on guides that are not shown in a direction that is perpendicular to the plane of the FIG. 1, i.e. in a direction that is substantially parallel to a third axis of said Cartesian reference system. When the wire 7 comes into contact with the substrate 8 the adhesive means that covers the external surface of the wire causes the adhesion thereof to the substrate 8. When the wire 7 comes into contact with the substrate 8 the adhesive substance that covers the external surface of the wire causes the adhesion thereof to the substrate 8. The force of adhesion of the adhesive substance is chosen so that, in the presence of a corresponding horizontal movement of the substrate 8 in relation to the depositing device 6', the portion of wire 7a adhering to the substrate 8 exercises on the rest of the wire 7, without detaching itself from the substrate 8, sufficient traction to cause the escape of further wire 7 from the dispensing spout 12'. During depositing of the wire 7 on the substrate 8, the slide 5 moves along the crosspiece 4 and the portal 2 moves along the support plane thereof, in a direction perpendicular to the direction of the movement of the slide 5, to trace the profile of the antenna, whilst the crosspiece 4 regulates the distance of the dispensing spout 12 from the substrate 8.

In FIG. 3, the apparatus 1 according to the invention has been shown with a single device 6' for dispensing and depositing the wire 7, mounted on the slide 5. It is understood that the apparatus 1 may comprise a plurality of devices 6', each of which is mounted on a respective slide 5 slidable on the crosspiece 4 of the portal 2.

The device 6' may be used also with the embodiment shown in FIGS. 1 and 2.

Furthermore, the portal 2 may comprise a plurality of crosspieces 4, on each of which a plurality of slides 5 is mounted, each with the respective device 6' for dispensing and depositing the wire 7.

Also in the embodiment of the invention shown in FIGS. 1 and 2 the portal 13 may comprise a plurality of crosspieces 15, on each of which a plurality of devices 6 for dispensing and depositing the wire 7 is fixed.

The embodiment of the invention illustrated in FIGS. 1 and 2 enables greater speed of depositing of the wire 7 in relation to the embodiment of the invention illustrated in FIG. 3, because during depositing of the wire on the substrate 8 the portal 13 and the dispensing devices 6 remain in a fixed position, whereas the support 9 on which the substrate 8 is placed moves in two directions that are substantially perpendicular to one another so that the wire 7 is deposited on the substrate 8 according to the preset route of the antennas to be made. As the mass of the support 9 and of the sliding elements 16 and 17 is significantly less than the mass of the devices 6', of the respective slides 5 and of the portal 2 that are moved in the embodiment of the invention disclosed in FIG. 1, the movements of the support 9 can be made at significantly greater speed than the movements of the portal 2 and of the slides 5, which enables a significant increase in productivity.

Furthermore, the number of depositing devices 6 can be increased without limits, without increasing the moving mass.

For example, by using a sheet measuring 70×100 cm, to produce transponders of the size of credit cards, up to 121 transponders can be made simultaneously, instead of the 6 that are currently producible with the known prior-art apparatuses.

Further examples of realizing the method of making antennas according to the invention are illustrated in FIGS. 6 to 14.

The antenna may be made using a metallic lamina 19, which is unwound from a reel 18, is pressed on the surface of a substrate 8 (FIG. 10) by a pressing element 22, for instance a pressing roller, and is cut by a cutting device 23.

As an alternative, the antenna may be made using a metallic wire 19a, which is unwound from a reel 18a, is pressed on the surface of the substrate 8 by the pressing element 22 (FIG. 6) and cut by the cutting device.

If a dipole antenna is intended to be made, a metallic lamina 19 will be used having a width equal to the width of the arms of the dipole antenna to be made, for instance the arms B1a, B2a; B1b; B2b; B1c; B2c; B1d, B2d of the dipole antennas A, B, C, D, respectively, illustrated in FIGS. 11 to 14, for instance a width of some millimeters and a thickness of some microns. The substrate 8 on which the antenna has to be formed may be arranged on a support element, which is made mobile along two directions perpendicular with each other and parallel to the surface of the support on which the substrate 8 is arranged, in a way quite similar to the way previously described with reference to FIGS. 1 and 2. The assembly comprised of the pressing roller 22, the cutting device 23 and, possibly, the reel 18, is made rotatable around an axis perpendicular to the plane of the surface of the substrate 8 and passing through the point in which the pressing roller 22 presses the lamina on the substrate 8.

In the event of an antenna made with a wire 19a (FIG. 6), the reel 18a may be kept stationary, so that only the assembly comprised of the pressing roller 22 and the cutting device 23 is made rotatable around an axis perpendicular to the plane of the surface of the substrate 8 and passing through the point in which the pressing roller 22 presses the lamina on the substrate 8.

The adhesion of the lamina 19, or wire 19a, to the substrate 1 may be obtained in various ways:

by applying in advance on the wire 19a, or on the face of the lamina 18 intended to come in contact with the substrate 8, an adhesive substance which, after drying, may be revived by supplying energy, for instance a thermoplastic adhesive substance;

by applying in advance on the face of the lamina 18 intended to come in contact with the substrate 8 a socalled "pressure sensitive" adhesive substance, that is a substance which activates when the lamina 19 is pressed onto the substrate 8 by the pressing roller 22; in this case, the face of the lamina opposed to the face on which the adhesive substance has been applied is protected by a layer of anti-adhesive substance, for instance a layer of silicone, or by an anti-adhesive removable film, in order to prevent superimposed turns of lamina 19 on the reel 18 from adhering to each other;

by applying an adhesive substance on the substrate 8 immediately before or during the deposition of the lamina 19, or wire 19a, onto the substrate 8.

Figure 7:
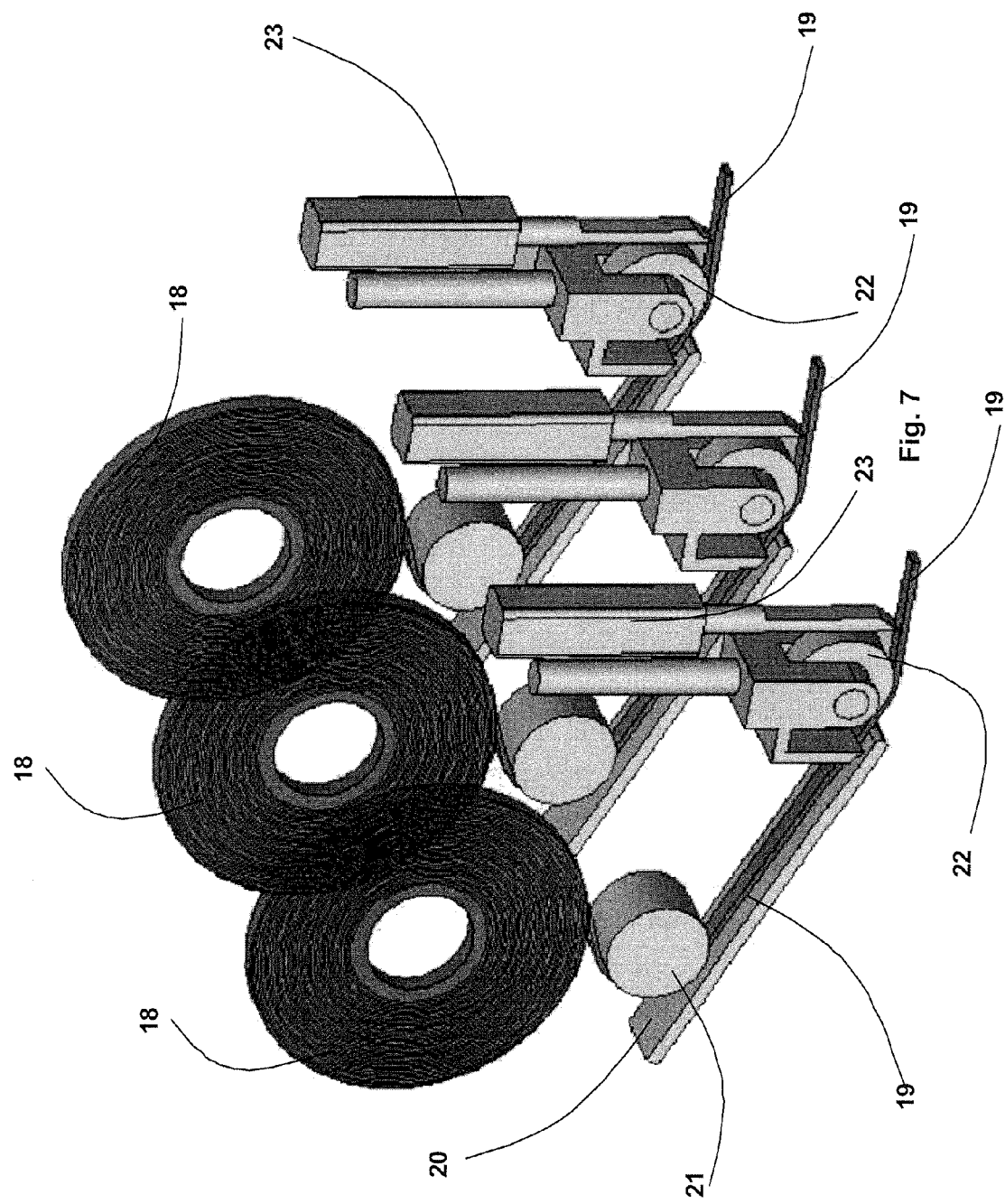
FIG. 7 is a perspective view of an example of a further way of making an antenna according to the invention.
Figure 8:
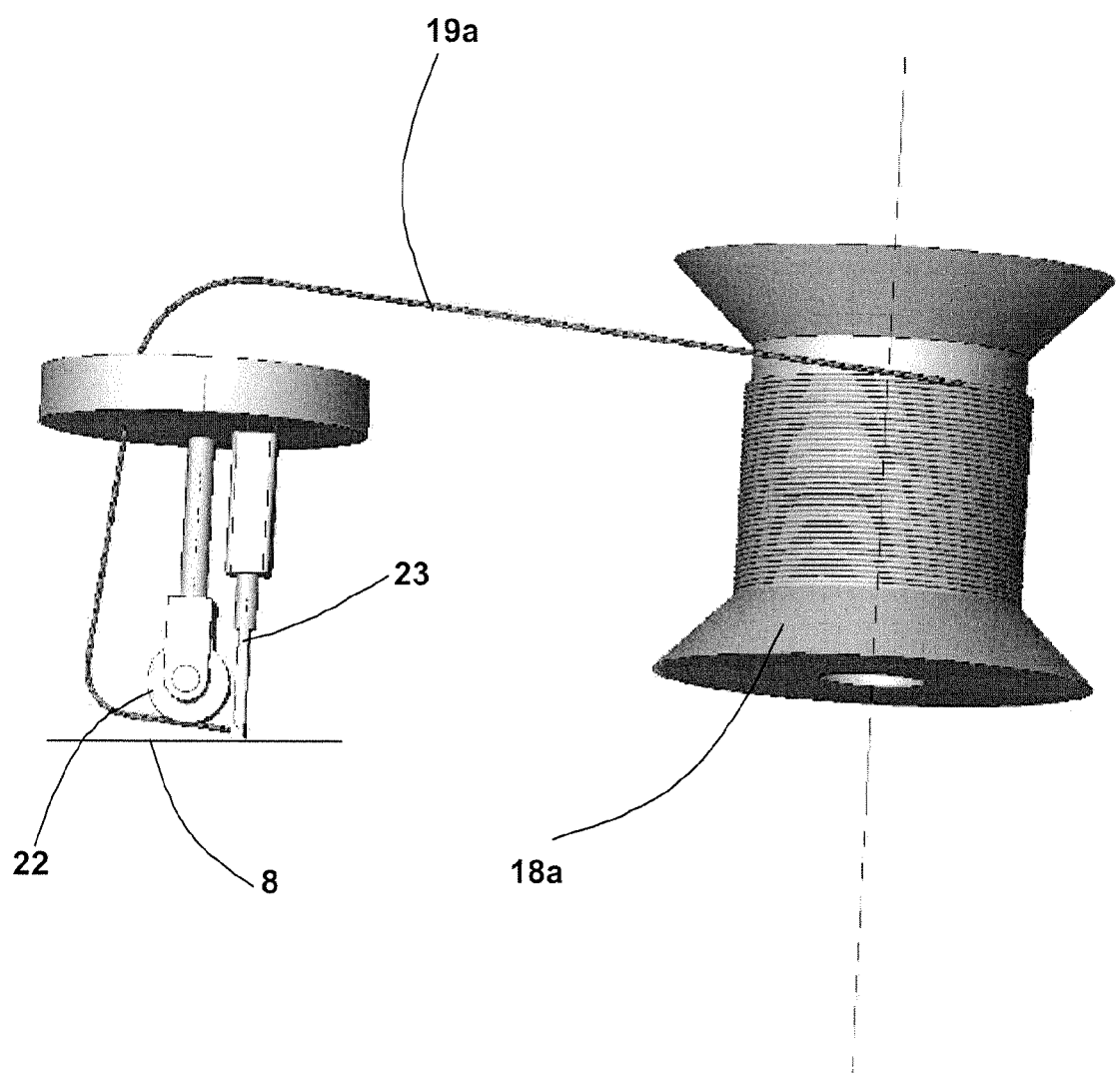
FIG. 8 is a perspective view of an example of a still further way of making an antenna according to the invention.

When dipole antennas such as the antennas illustrated in FIGS. 12 to 14 are realized, during deposition of the lamina 19 onto the substrate 8, the support element moves along the direction along which the lamina 19 has to be deposited on the substrate 8 to obtain a first arm, or a first portion of arm of the dipole antenna. When the first arm, or portion of arm, has been completed, in order to obtain a second arm, or portion of arm, of the dipole antenna, the support element of the substrate 8 is moved along the new direction along which said second arm, or portion of arm, is to be oriented and the assembly comprised of the reel 18, the pressing roller 22 and the cutting device 23 is rotated around an axis perpendicular to the surface of the substrate 8 and passing through the point where the pressing roller 22 presses the lamina 19 on the substrate 8, so that the lamina 19 unwinding from the reel 18 is aligned along said new direction. A similar procedure is used to realize antennas of any shape made of wire 19. This method allows a plurality of antennas to be realized simultaneously on the substrate 8, by providing a plurality of assemblies comprised of reel 18, pressing roller 22, cutting device 23, each of which is capable of rotating around said axis perpendicular to the surface of the support element (FIG. 7). In general, the support element and the assembly, or each assembly, comprised of the reel 18, the pressing roller 22 and the cutting device 24 must be planned in such a way as to be capable of rotating with respect to one another around an axis perpendicular to the surface of the support and positioned on the point of contact of the lamina 19 with the substrate 8.

Figure 9:
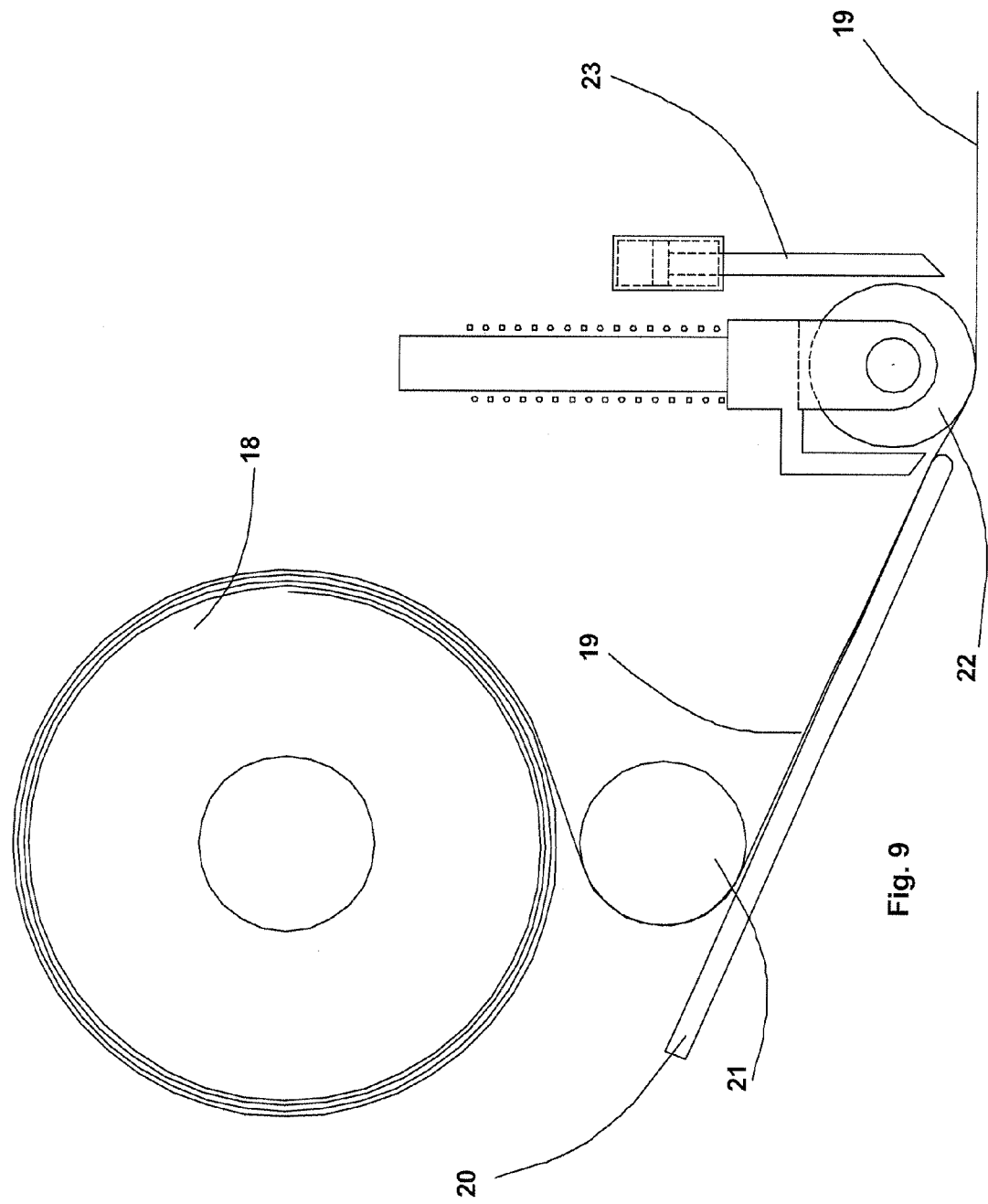
FIG. 9 is a side view of FIG. 6.

FIG. 9 illustrates another example of realization of the method according to the invention, in which a face of the metallic lamina 19 is smeared with a pressure sensitive adhesive substance, that is a substance that activates when the lamina 19 is presses onto the substrate 8 by the pressing roller 22. The face of the lamina opposed to the face on which the adhesive substance has been smeared is protected by an anti-adhesive film, in order to prevent the turns of the lamina 19 on the reel 18 from adhering to each other. The anti-adhesive film is re-wound on a collecting roller 25, after the lamina 19 has been separated from the film and deposited on the substrate 8.

Figure 10:
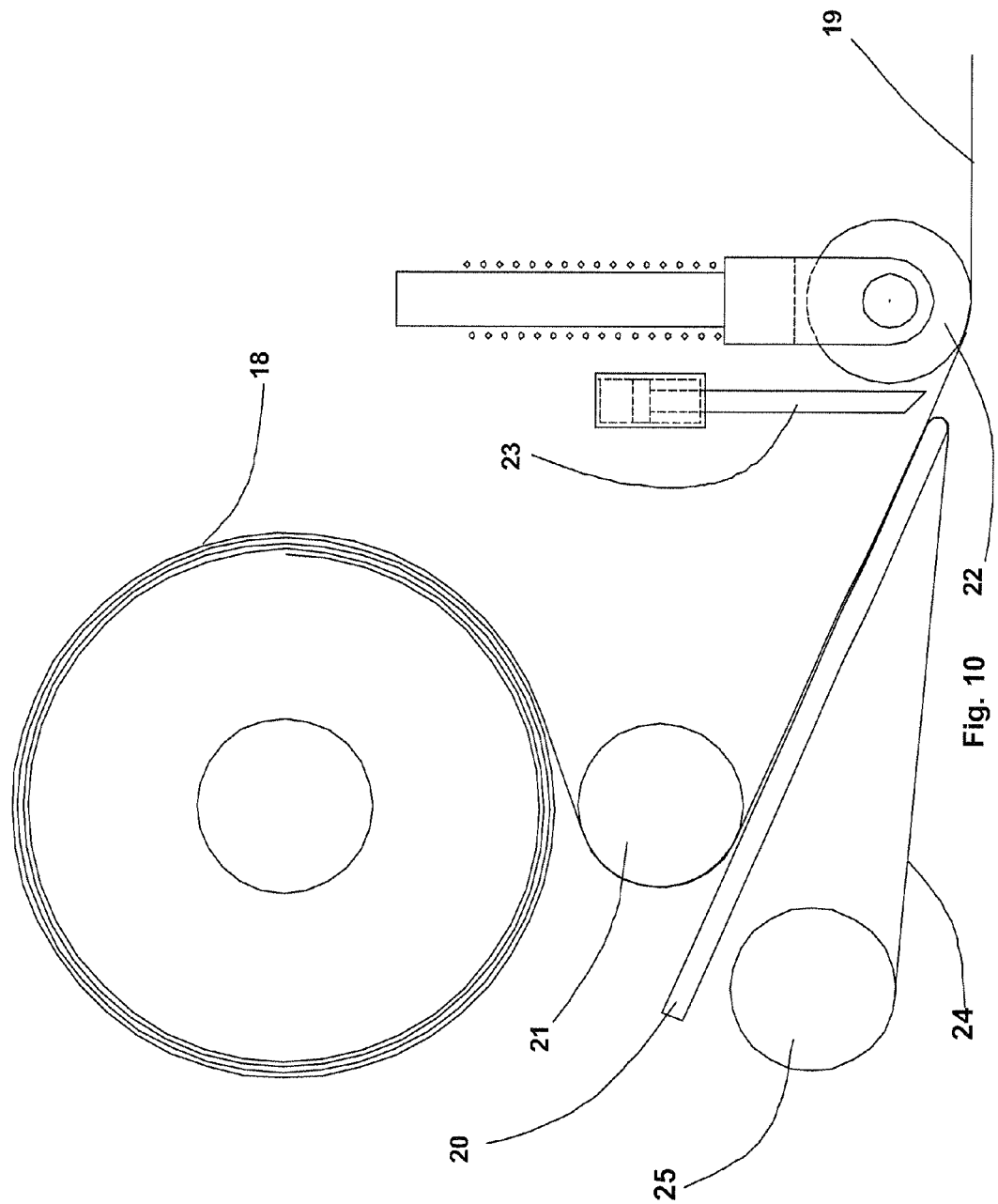
FIG. 10 is a side view of a variation of the example of a way of making an antenna illustrated in FIGS. 6, 7 and 9.
Figure 11:
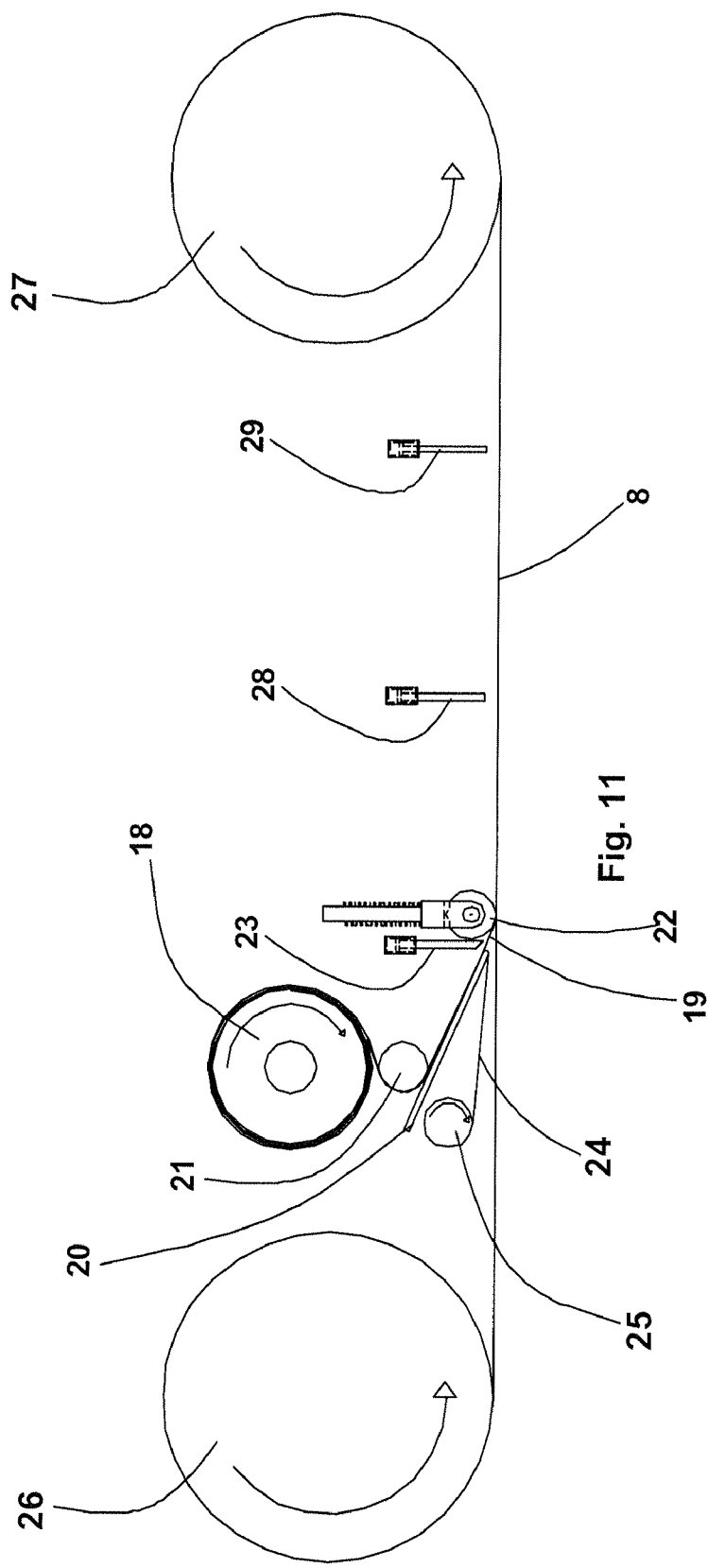
FIG. 11 is a schematic view of a production system for antennas according to the invention.

FIG. 10 illustrates a further example of realization of the method according to the invention, particularly suitable for making on a single substrate 8 a plurality of dipole antennas having rectilinear arm, like the antenna A in FIG. 11.

In this example of realization, the assembly comprising the reel 18, the pressing roller 22 and the cutting device 23, is kept stationary, while the substrate 8 is moved under said assembly, for instance by unwinding the substrate from a first reel 26 and re-winding it on a second reel 27. On the reel 18 a plurality of laminas 19 of electrically conductive material may be wound. The laminas 19 are arranged in such a way as to be parallel with each other when they are unwound from the reel 18. As an alternative, a plurality of reel 18 arranged side by side, on each of which a lamina 19 is wound, may be provided, each reel being operatively associated with a respective pressing roller 22 and a respective cutting device 23. In this way it is possible to simultaneously deposit and fix a plurality of stretches of lamina 19 on the substrate 8, thus obtaining a plurality of dipole antennas A with rectilinear arms in a single production phase. Downstream the assembly comprised of the reel 18, the pressing roller 22 and the cutting device 23, are arranged in series a depositing device 28 for depositing, between the two arms of the dipole antenna A, a modular element EM (FIG. 12) on which a microchip is mounted, and a soldering device 29 to electrically connect by soldering the modular element EM and, thus, the microchip MC to the arms of the dipole antenna A.

The modular element EM with the microchip MC is used to make any type of transponder, such as, for instance, the transponders with dipole antennas B, C, D shown in FIGS. 13, 14, and 15, or even induction transponders. The arms of the dipole antennas B, C, D, respectively B1b, B2b, B1c, B2c, B1d, B2d, are connected with each other by means of the modular element EM thus obtaining the electrical connection between the two arms of the dipole antenna and the microchip MC.

Likewise, the ends of an antenna of an induction transponder are connected with each other by means of a modular element EM.

In the practical embodiment, the materials, the dimensions and the constructional details can be different from those indicated, but be technically equivalent to them without thereby departing from the scope of the invention defined by the claims.

The invention claimed is:

1. An apparatus for making an antenna for wire transponders of electrically conductive material, comprising at least one depositing device for depositing said wire on a substrate placed on a support element, said at least one depositing device and said substrate being movable with respect to each other, wherein the apparatus further comprises at least one applicator device for applying an adhesive substance to said wire before said wire is deposited on said substrate, wherein said at least one applicator device comprises a container supplied with said adhesive substance, said wire passing through said container before being deposited on said substrate, and wherein said at least one depositing device comprises a guide element for guiding said wire inside said container and a dispensing element for guiding said wire outside the container for subsequent depositing on said substrate.

2. The apparatus according to claim 1, wherein said at least one depositing device and said substrate are movable with respect to one another along three directions substantially parallel to the axes of a Cartesian reference system.

3. The apparatus according to claim 1, furthermore comprising at least one cutting device for cutting said wire near a lower end of said depositing device.

4. An apparatus for making an antenna for wire transponders of electrically conductive material, comprising at least one depositing device for depositing said wire on a substrate placed on a support element, said at least one depositing device and said substrate being movable with respect to each other, wherein the apparatus further comprises at least one applicator device for applying an adhesive substance to said wire before said wire is deposited on said substrate, and a slide movable along a first direction substantially parallel to a first axis of a Cartesian reference system, said at least one depositing device being associated with said slide.

5. The apparatus according to claim 4, wherein said at least one depositing device is movable along a direction substantially parallel to a second axis of said Cartesian reference system.

6. The apparatus according to claim 4, wherein said slide is slidingly coupled with a support element, said support element being movable along a direction substantially parallel to a third axis of said Cartesian reference system.

7. The apparatus according to claim 6, wherein said support element comprises a pair of uprights, connected above by at least one crosspiece, said slide being slidingly coupled with said at least one crosspiece.

8. The apparatus according to claim 7, wherein said at least one crosspiece is movable along a direction parallel to a second axis of said Cartesian reference system.

9. The apparatus according to claim 7, wherein a plurality of slides is slidingly coupled with said at least one crosspiece, each of said slides being associated with a respective depositing device.

10. The apparatus according to claim 6, wherein said support element comprises a plurality of crosspieces fixed to said uprights, with each crosspiece of said plurality of crosspieces there being slidingly coupled at least one slide means, associated with a respective depositing device.

11. The apparatus according to claim 10, wherein with each crosspiece of said plurality of crosspieces there is associated a plurality of slides, each of said slides being associated with a respective depositing device.

12. The apparatus according to claim 10, wherein each crosspiece of said plurality of crosspieces is movable in a direction substantially parallel to a second axis of said Cartesian reference system.

* * * * *